United States Patent
Greene et al.

(10) Patent No.: US 7,833,873 B2
(45) Date of Patent: Nov. 16, 2010

(54) METHOD AND STRUCTURE TO REDUCE CONTACT RESISTANCE ON THIN SILICON-ON-INSULATOR DEVICE

(75) Inventors: Brian J. Greene, Danbury, CT (US); Louis Lu-Chen Hsu, Fishkill, NY (US); Jack Allan Mandelman, Flat Rock, NC (US); Chun-Yung Sung, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/174,683

(22) Filed: Jul. 17, 2008

(65) Prior Publication Data

US 2008/0274597 A1    Nov. 6, 2008

Related U.S. Application Data

(63) Continuation of application No. 11/413,010, filed on Apr. 28, 2006, now Pat. No. 7,479,437.

(51) Int. Cl.
*H01L 21/76* (2006.01)
(52) U.S. Cl. .................. 438/409; 438/583; 438/508; 438/E21.151

(58) Field of Classification Search ......... 438/301–308, 438/370–376, 517–533
See application file for complete search history.

(56) References Cited

U.S. PATENT DOCUMENTS

| 5,936,306 | A | 8/1999 | Jeng |
| 6,369,429 | B1 | 4/2002 | Pramanick et al. |
| 6,746,926 | B1 | 6/2004 | Yu |
| 6,872,642 | B2 | 3/2005 | Oda et al. |
| 7,531,423 | B2 * | 5/2009 | Cheng et al. ............. 438/409 |
| 2006/0281271 | A1 | 12/2006 | Brown et al. |
| 2007/0010051 | A1 | 1/2007 | Wu et al. |
| 2007/0181955 | A1 | 8/2007 | Chen et al. |

OTHER PUBLICATIONS

L.T. Su, M. J. Sherony, H.Hu, J.E. Cheung, and D.A. Antoniadis, "Optimization of Series Resistance in Sub-0.2mm SOI MOSFET'S", IEEE Electron Device Letters, vol. 15, No. 9, Sep. 1994, p. 363-365.

* cited by examiner

*Primary Examiner*—Dung A. Le
(74) *Attorney, Agent, or Firm*—McGinn IP Law Group, PLLC; Vazken Alexanian

(57) ABSTRACT

A method (and system) of reducing contact resistance on a silicon-on-insulator device, including controlling a silicide depth in a source-drain region of the device.

17 Claims, 15 Drawing Sheets

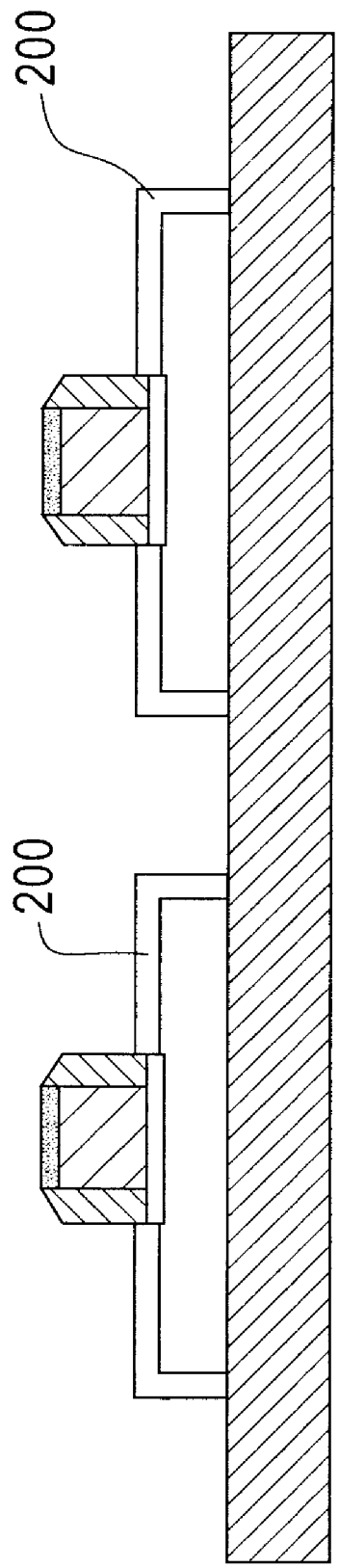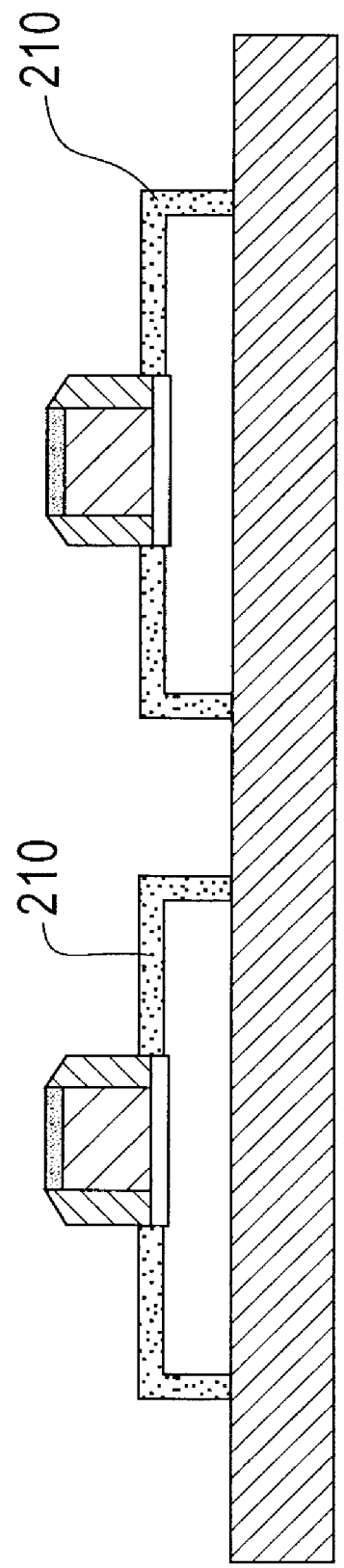

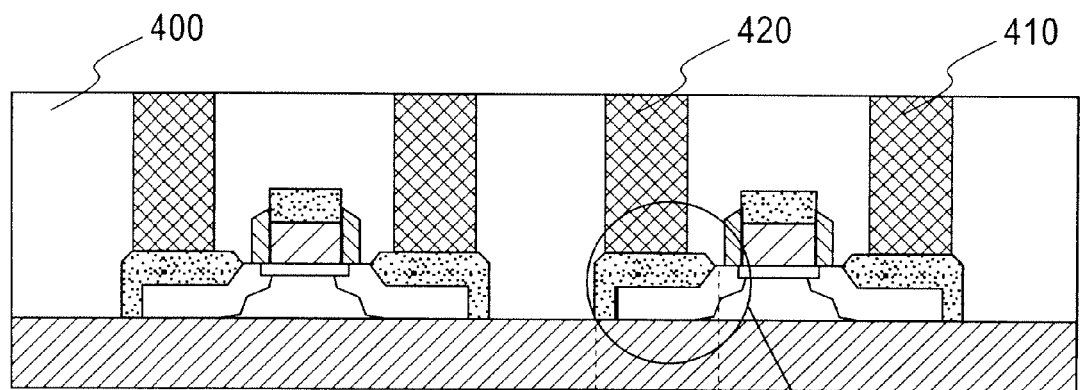
FIG. 14A
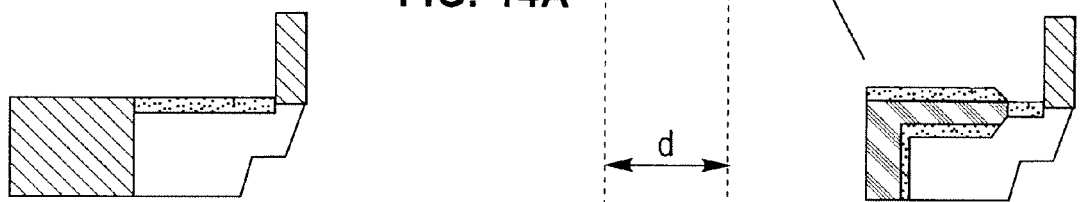
FIG. 14D PRIOR ART
FIG. 14C
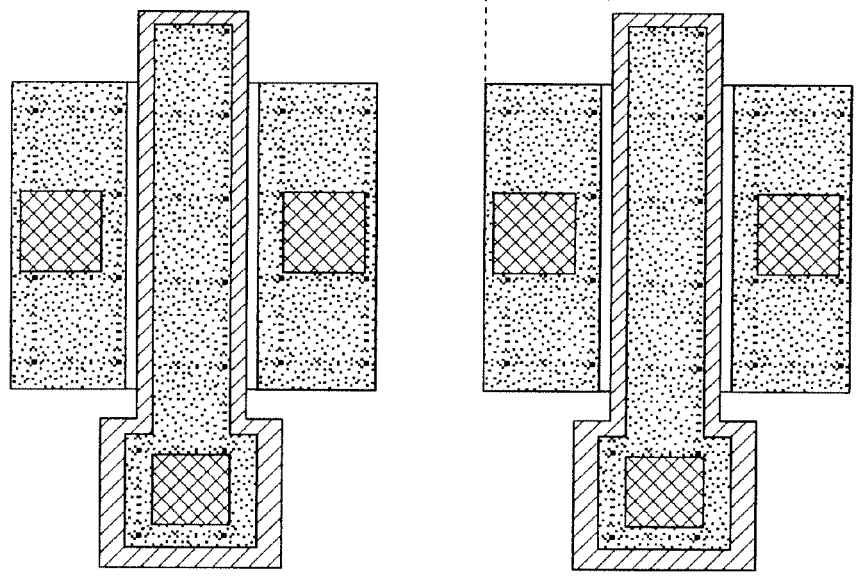
FIG. 14B

METHOD AND STRUCTURE TO REDUCE CONTACT RESISTANCE ON THIN SILICON-ON-INSULATOR DEVICE

The present application is a Continuation Application of U.S. patent application Ser. No. 11/413,010 filed on Apr. 28, 2006 now U.S. Pat. No. 7,479,437.

BACKGROUND OF THE INVENTION

1. Field of the Invention

The present invention generally relates to a method and apparatus for reducing contact resistance, and more particularly to a method and apparatus for reducing source/drain series resistance in an ultra-thin silicon-on-insulator metal-oxide-silicon field effect transistor.

2. Description of the Related Art

As silicon-on-insulator (SOI) metal-oxide-silicon field effect transistor (MOSFET) channel lengths continue to be aggressively scaled from the 65 nm to the 45 nm node and beyond, it is necessary to reduce the SOI film thickness to suppress short channel effects. However, a consequence of thinner (less than about 30 nm) SOI is increased difficulty in forming low-series resistance source-drain contacts. Not only does the thinner SOI reduce the cross-sectional area normal to the current, but it becomes increasingly difficult to avoid silicidation of the source-drain diffusions from extending completely through the SOI to the back (or buried) oxide (BOX).

It is conventionally known that the source-drain resistance increases sharply when the silicided region reaches the BOX, since the resistance is strongly determined by the interface resistance between the silicide and the single crystal silicon. One presently used solution is to selectively increase the source-drain thickness using a structure known as a "raised source/drain". A method for forming raised source/drain involves epitaxial-growth, which leads to increasing the gate-to-source and drain overlap capacitance (Miller capacitance) and degraded performance.

Another concern of the conventional art is the possibility of silicide spiking into the junction area, especially at the edges of the channel region.

SUMMARY OF THE INVENTION

In view of the foregoing and other exemplary problems, drawbacks, and disadvantages of the conventional methods and structures, an exemplary feature of the present invention is to provide a method and structure in which a silicide depth in a source/drain region of a metal-oxide-silicon field effect transistor (MOSFET) is precisely controlled to avoid silicidation from consuming the entire source/drain diffusion.

In accordance with a first aspect of the present invention, a method (and system) of reducing contact resistance on a silicon-on-insulator device includes controlling a silicide depth in a source-drain region of the device.

In accordance with a second aspect of the present invention, a metal-oxide-silicon field effect transistor includes a silicide layer deposited over a source/drain region of the metal-oxide-silicon field effect transistor. The source/drain region includes a core portion that is devoid of silicide.

In accordance with a third aspect of the present invention, a metal-oxide-silicon field effect transistor includes a silicide layer deposited over a source/drain region of the metal-oxide-silicon field effect transistor, wherein a depth at which silicide is present in the source/drain region is controlled.

It is an exemplary feature of the present invention to provide a reduced source/drain series resistance in a MOSFET device. In accordance with certain exemplary aspects of the present invention, the MOSFET device includes an ultra-thin (e.g., less than about 30 nm) silicon-on-insulator (SOI) MOSFET.

The present invention provides a robust method of precisely controlling the silicide depth in the source-drain region of a MOSFET, thus avoiding silcidation consuming the entire source-drain diffusion. The method assures than an unsilicided region remains in the interior of the source-drain. Thus, the interface area between the silicide and a single crystal silicon is increased and the series resistance is reduced.

In accordance with an exemplary aspect of the present invention, the method of reducing contact resistance on a silicon-on-insulator device includes exposing the sidewalls of the source/drain regions, forming porous silicon within a surface region of the source/drain, implanting dopants and forming silicide. An alternative approach is to selectively thicken the exposed source and drain regions after exposing the sidewalls of the source-drain regions by epitaxial-growth with an in-situ p+ doping. Subsequent anodization of the p+ epitaxial layer forms a porous layer of very well controlled thickness.

Furthermore, the present invention provides a process for forming dummy spacers with a predetermined width for the purpose of avoiding silicide spiking into the junction area.

Additionally, another feature of the invention is to remove spacers that would otherwise cover the sidewalls of the exposed source-drain islands, thus increasing the source-drain diffusion area available for introducing dopant and for forming contacts.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIGS. 1-14C illustrate an exemplary method of forming a MOSFET while controlling the silicide depth in the source/drain region of the MOSFET in accordance with certain embodiments of the present invention.

DETAILED DESCRIPTION OF EXEMPLARY EMBODIMENTS OF THE INVENTION

Figure 1:
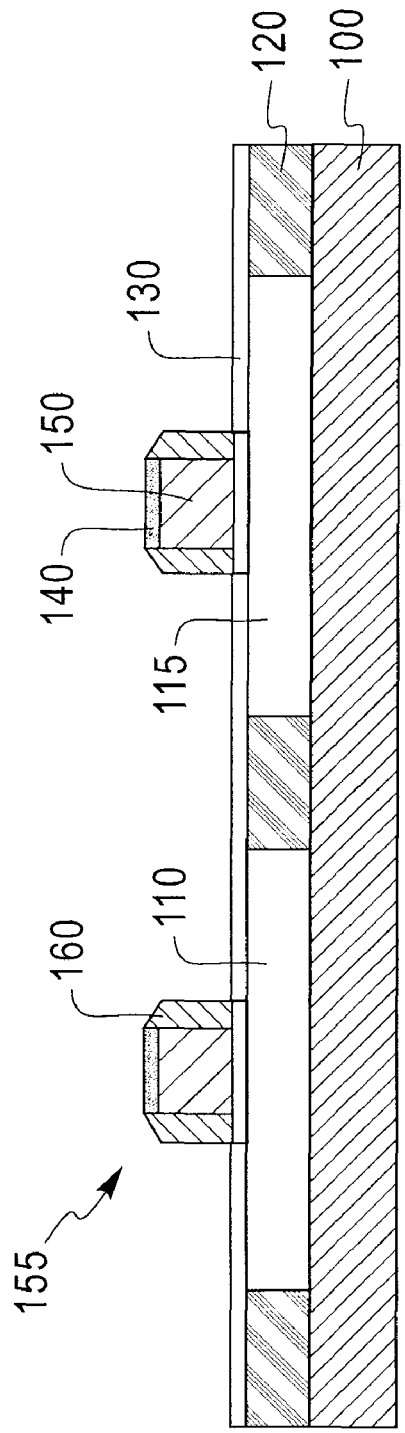

Referring now to the drawings, and more particularly to FIGS. 1-15, there are shown exemplary embodiments of the method and structures according to the present invention.

FIGS. 1-14 illustrate an exemplary method of forming a MOSFET while controlling the silicide depth in the source/drain region of the MOSFET in accordance with certain embodiments of the present invention.

First, as depicted in FIG. 1, a low-k material (e.g., such as chemical vapor deposition (CVD) SiCOH, and spin-on low-k polymer material including SiLK and JSR porous low-k polymer, etc.) is used to form a sacrificial shallow trench isolation 120 on a silicon-on-insulator (SOI) wafer having a buried oxide layer 100. The bodies on the SOI wafer, which form pMOS 115 and nMOS 110, are properly doped. That is, doped to form a fully depleted body with a dopant concentration (p-type for NMOS and n-type for PMOS) of about $1E17/cm^3$. Boron is an exemplary dopant for the PMOS and phosphorous and arsenic are exemplary dopants for the NMOS. A gate dielectric 130 and gate structure, which includes a gate 150, a cap 140 and spacers 160, are formed using conventional processing steps.

To provide improved etch selectivity, the cap 140 and spacers 160 may be made of nitride. Note that, the spacers 160 are also sacrificial since they will be removed in a later stage. The spacers 160 used here define the distance between subsequent silicided areas and the edge of the gates 150. The width of the spacers are controlled to a predetermined value (e.g., 10 nm to 30 nm) to avoid leakage due to silicide spiking through the junctions.

Figure 2:
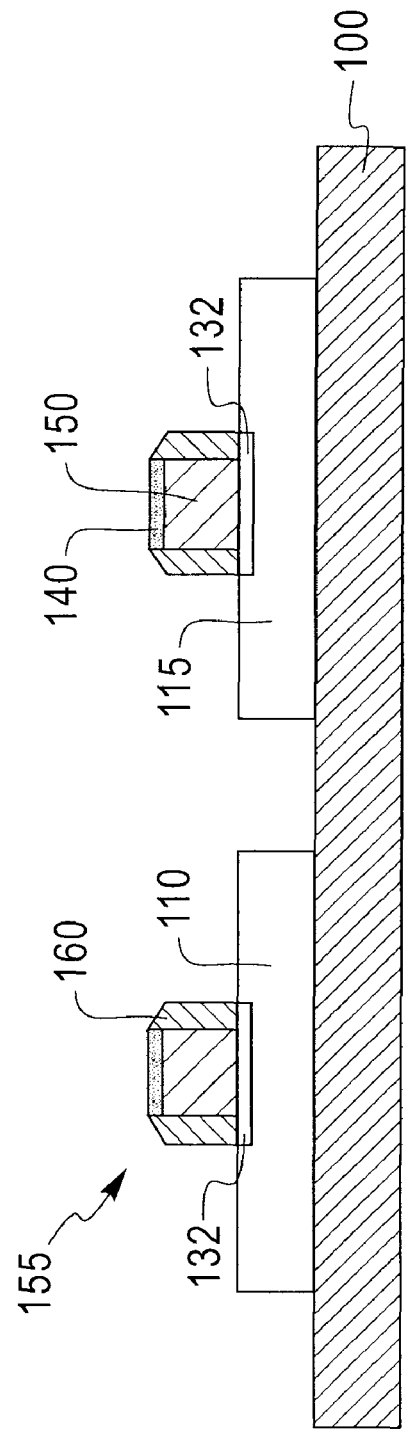

Next, as illustrated in FIG. 2, the exposed portion of the gate dielectric 130 (e.g., normally a thin oxide) is etched off. Then, the exposed low-k dielectric 120 is directionally etched, stopping at the buried oxide layer 100. The etching processes (e.g., the etching of the gate dielectric 130 and the low-k dielectric 120) may include, for example, reactive ion etching (RIE). Although good etch selectivity between the low-K material 120 and the buried oxide 100 can be achieved, slightly over-etching into the buried oxide layer 100 is not a serious problem. Therefore, a certain degree of etching may occur to the buried oxide layer 100. At this point, the low-k dielectric 122 (e.g., depicted in FIG. 3B) underlying the gate region is preserved. After the above etching steps, the silicon islands' source-drain regions 150 are exposed.

Figure 2A:
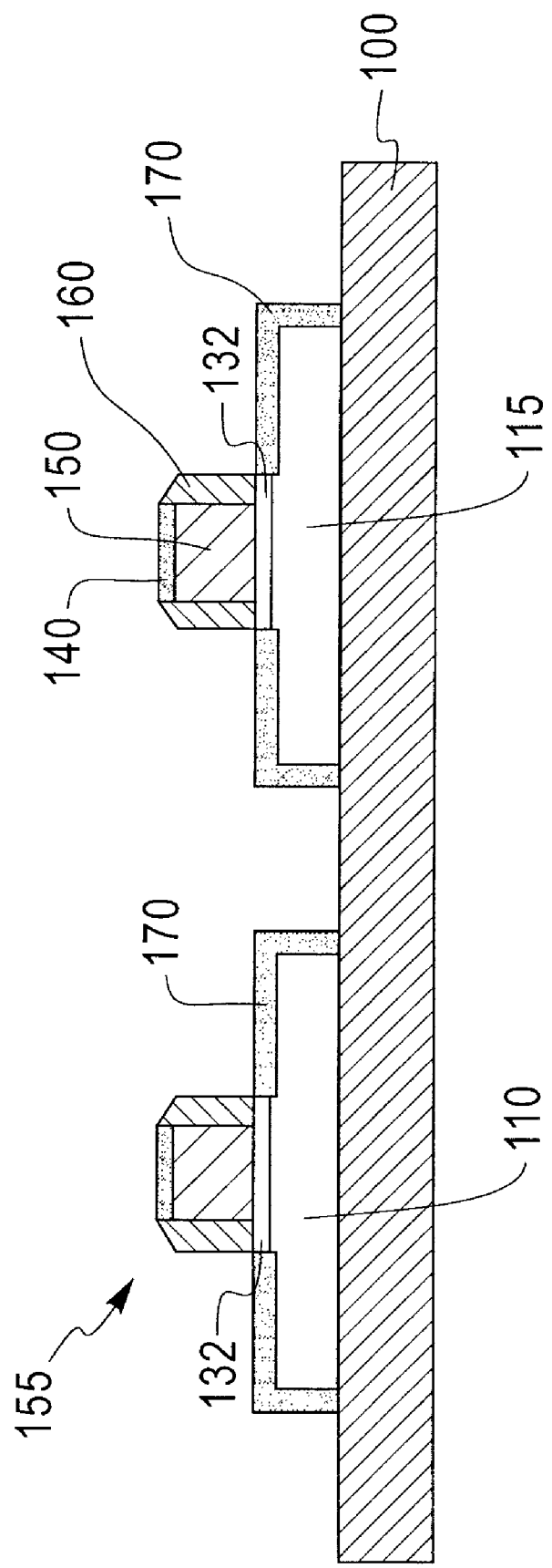

Following the etching of the low-K material 120 (e.g., depicted in FIG. 2), a shallow layer of P+ doping 170 is introduced into the exposed surfaces of the SOI (i.e., the pMOS 115 and nMOS 110) by any of well known methods such as ion implantation, gas phase doping, plasma immersion doping, or solid source doping (e.g., see FIG. 2A). The thickness of the high-concentration shallow p-type region is easily well controlled, and determines the thickness of the subsequently formed silicide.

Figure 2B:
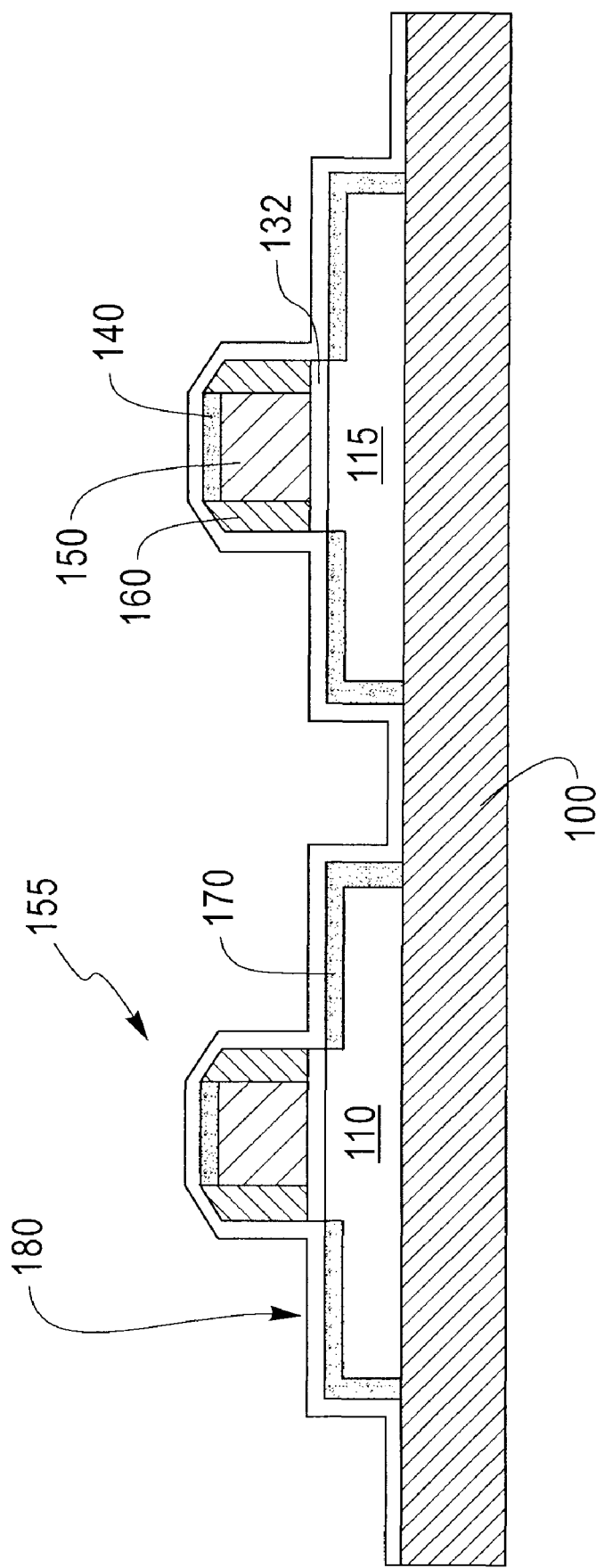

Next, a layer of silicon nitride 180 (nitride liner) is conformally deposited over the SOI structure (e.g., see FIG. 2B). The silicon nitride layer 180 may have a thickness in a range of 20 nm to 50 nm, and is deposited over the exposed portions of the buried oxide layer 100, the exposed portions of the pMOS 115 and the nMOS 110, and the gates 150.

Figure 2C:
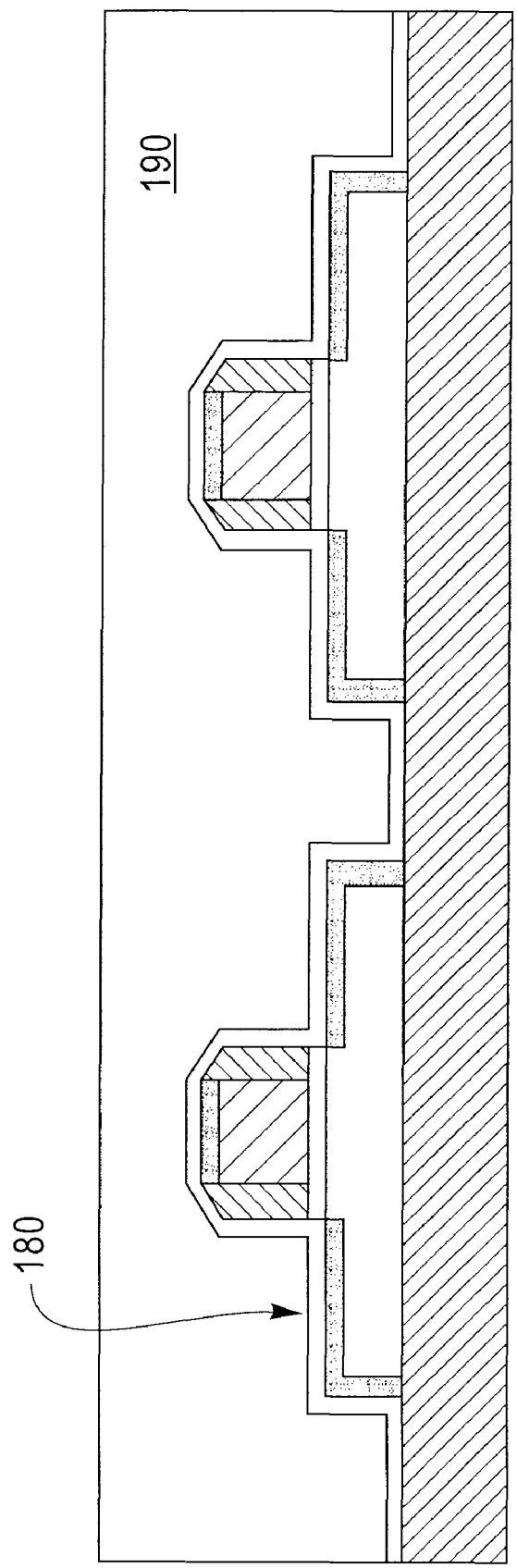

Then, a planarized resist 190 is applied over the layer of silicon nitride 180 (e.g., see FIG. 2C).

Figure 2D:
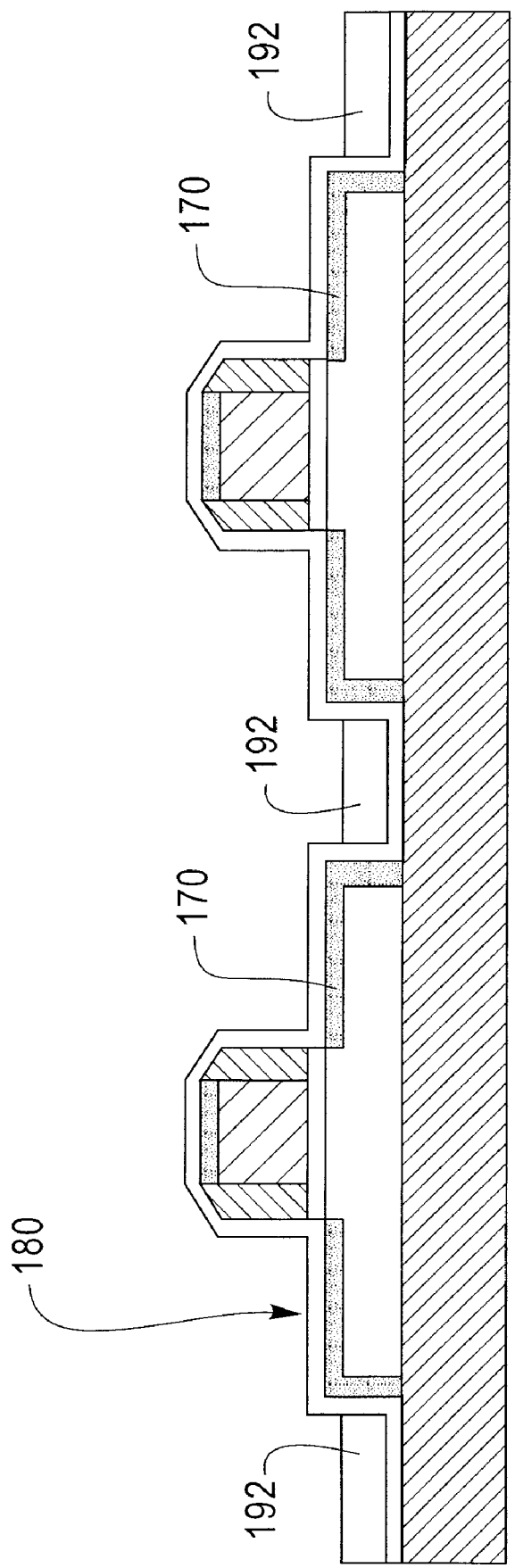

The planarized resist 190 is then recessed to a depth that exposes a top surface of the nitride liner 180 covering the SOI (e.g., see FIG. 2D). The exposed nitride liner 180 is etched (e.g., RIE). The etch continues until the nitride is removed from the horizontal surface of the SOI source/drain regions 155. Portions 182, 184 of the nitride liner, however, remain over the exposed top surfaces of the buried oxide layer 100 and vertical side portions of the gates 150.

Figure 2E:
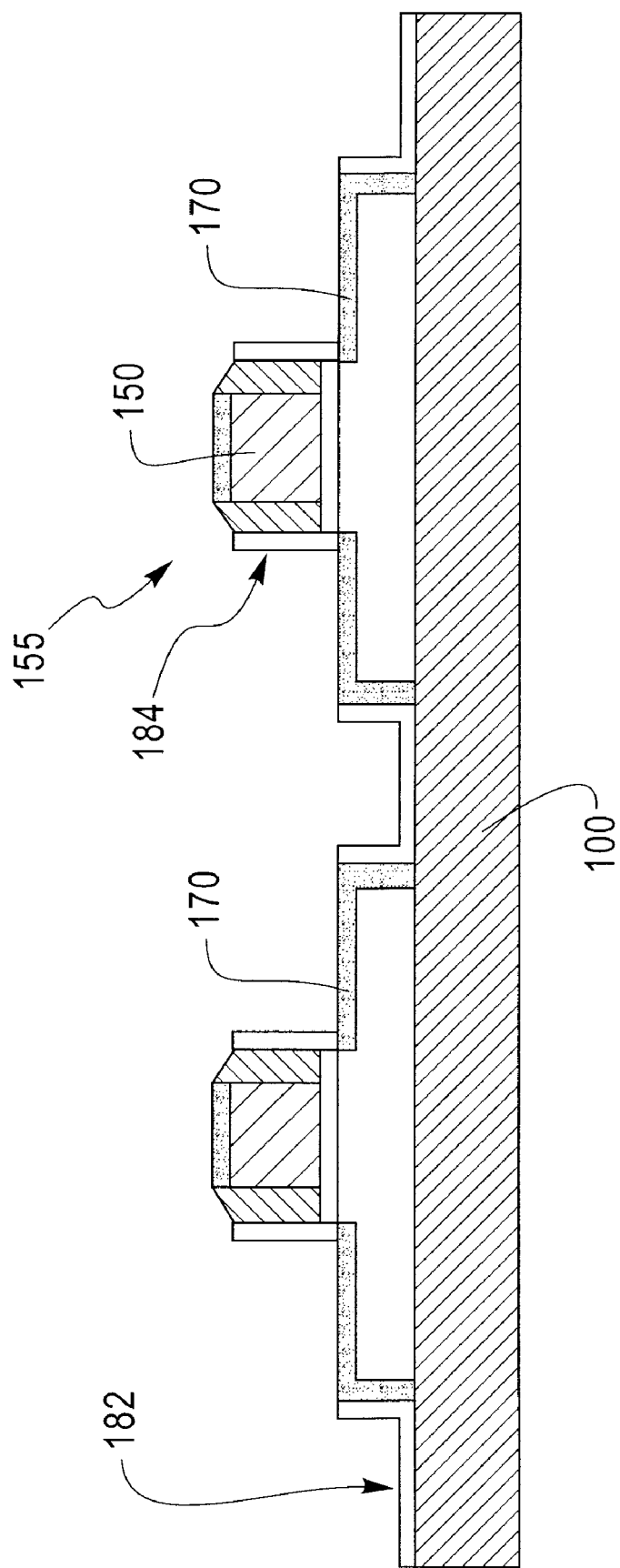

The recessed resist 192 is then stripped (e.g., see FIG. 2E).

Figure 3A:
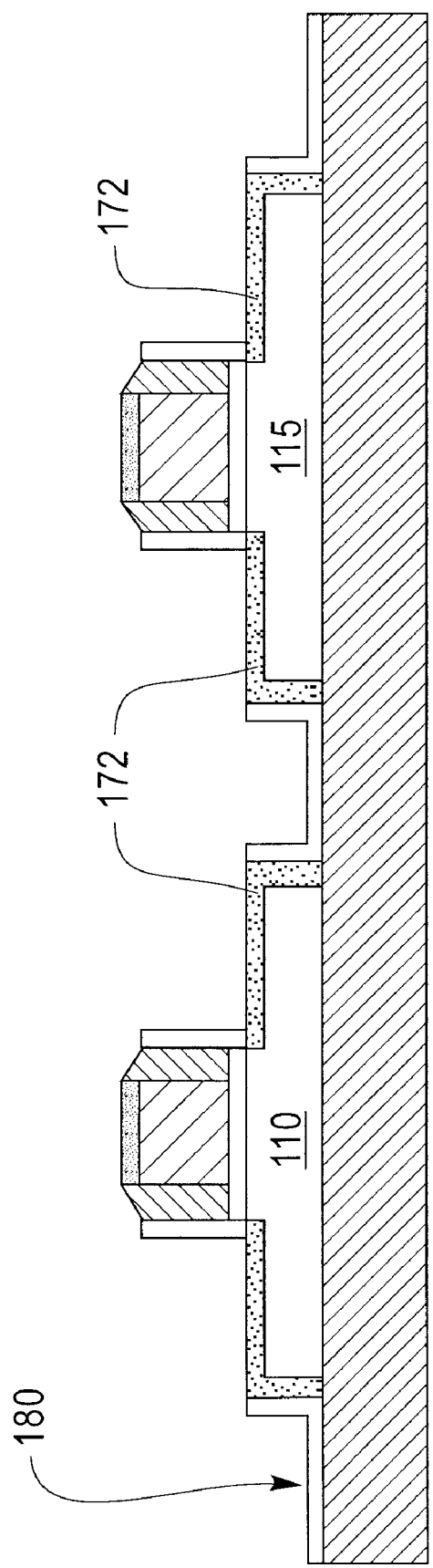

Next, a porous silicon layer 172, having a thickness predetermined by the depth of the P+ doping layer 170, is formed on the exposed source/drain regions 155, using well known conventional contactless porous silicon formation technique (e.g., see FIG. 3A).

During this portion of the process, all oxide regions are well protected from the hydrofluoric acid-containing porous silicon electrolyte. Specifically, the gate dielectric 130 under the edges of the gate conductor 150, the low-K dielectric 120 under the gate conductor 150 in the isolation regions, and the buried oxide layer 100 are protected by the nitride liner 180.

A subsequent hydrogen bake removes excess p-type dopant from the porous silicon 172. In accordance with certain exemplary aspects of the invention, the hydrogen bake is conducted at relatively low temperatures (e.g., less than 900° C.) to avoid excessive sealing of the pores.

Figure 3B:
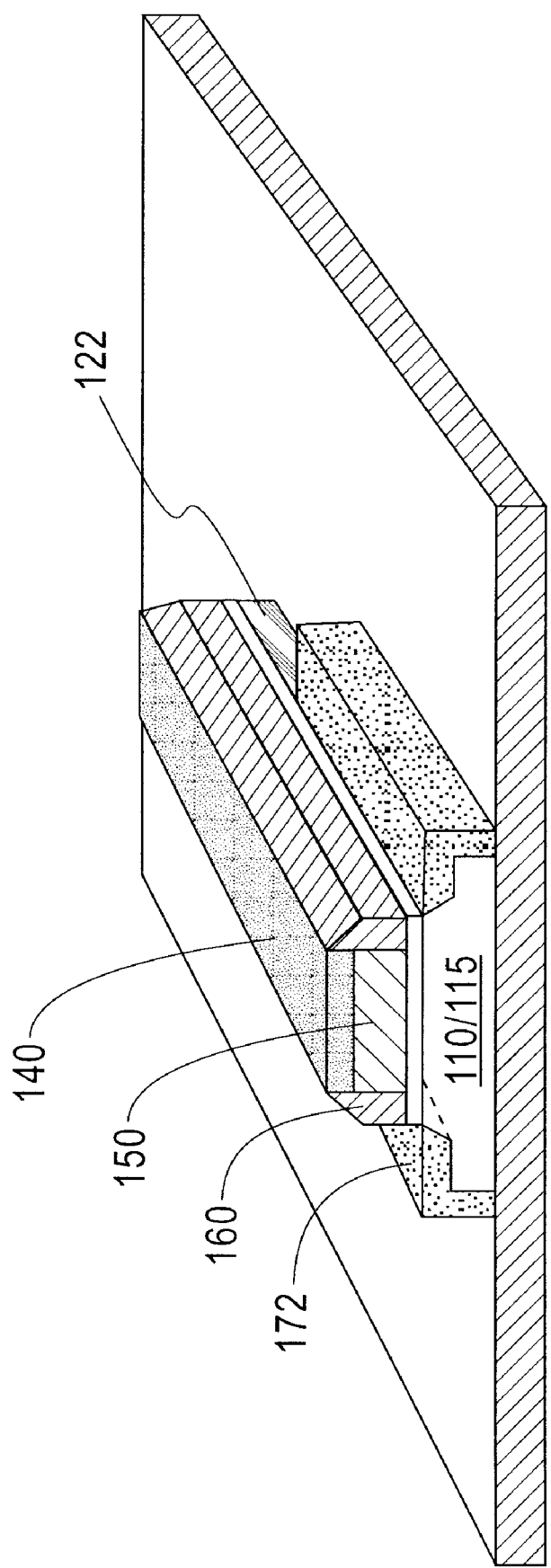

As depicted in FIG. 3B, a portion of the low-k material 122 remain in the shallow trench isolation (STI) underneath the gate 150. Also, the porous silicon 172 formed and wrapped around the exposed source/drain regions 155 is also shown. The large porous silicon 172 surface area significantly increases the effective source/drain contact area. In FIG. 3B, the nitride liner 180 is omitted for clarity, although it may optionally be removed with a short isotropic nitride etch.

In accordance with an alternate embodiment of the present invention, exemplarily illustrated in FIG. 3C, an epitaxial layer 200 with a p+ in-situ doped layer is formed to thicken the exposed source/drain regions. This approach may be desirable when the original SOI is thinner than 30 nm. Prior to the epitaxial layer 200 growth, the nitride liner 180 may be removed with a short isotropic nitride etch.

The epitaxial layer 200 is converted into porous silicon 210 in a subsequent contactless anodization process (e.g., see FIG. 3D). This approach restricts the silicided regions to the surfaces of the exposed source and drain areas to a safe distance (e.g., in a range of 10 nm to 30 nm) from the junction at the edges of the gate. Since the sacrificial spacers are thicker than the real spacers, the gate overlap capacitance is drastically reduced. Optionally, after forming the porous silicon layer 210, the remaining p+ dopants may be further depleted by an additional bake in a hydrogen ambient.

Figure 4:
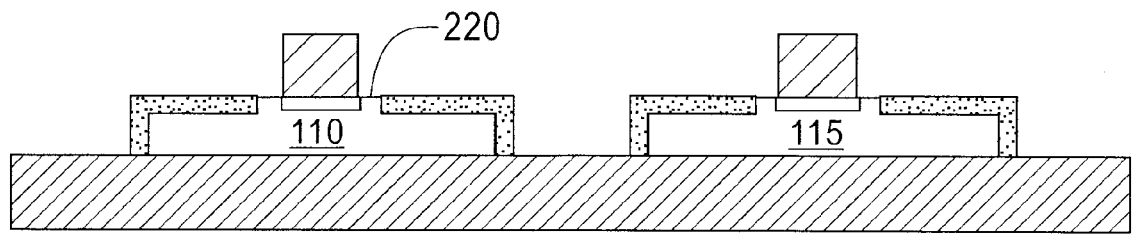

Next, the dummy spacers 160 are stripped by wet or dry etching, which also removes the cap layer 140 on top of the gates. This wet or dry etching results in an exposed surface portion 220 of the pMOS 115 and nMOS 110 at a location where the dummy spacers 160 were, as illustrated in FIG. 4.

Figure 5:
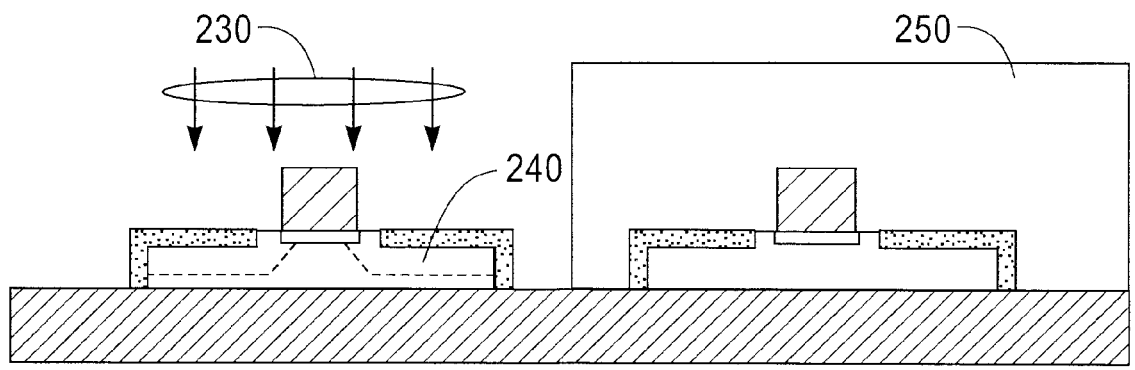
Figure 6:
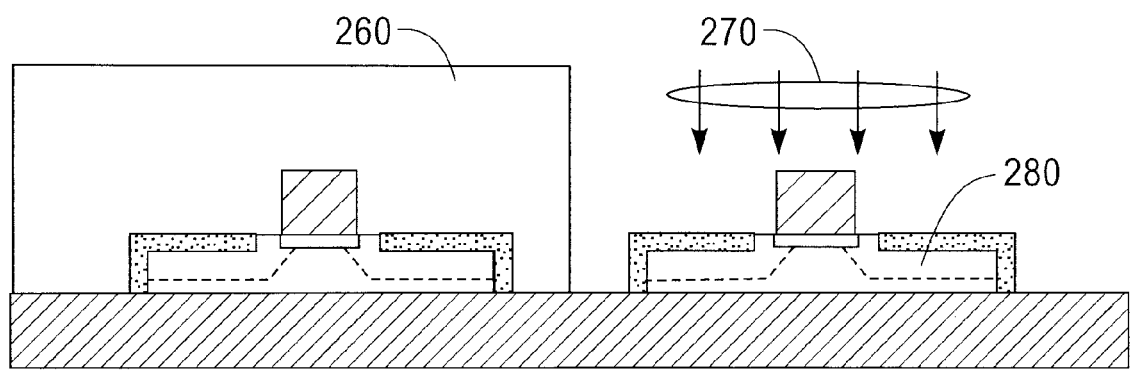

The next steps involve conventional extension (or lightly doped drain (LDD)) and halo implants on pMOS and nMOS devices, as illustrate in FIGS. 5 and 6. Specifically, reference numerals 230 and 270 represent a source and drain doping, while reference numerals 250 and 260 represent masks used. First dopants (n-type or p-type) 230 form lightly doped source/drain regions 240, with a concentration in a range of $1E18/cm^3$ to $1E19/cm^3$. Second dopants (n-type or p-type) 270 form lightly doped source/drain regions 280, with a concentration in a range of $1E18/cm^3$ to $1E19/cm^3$.

Figure 7:
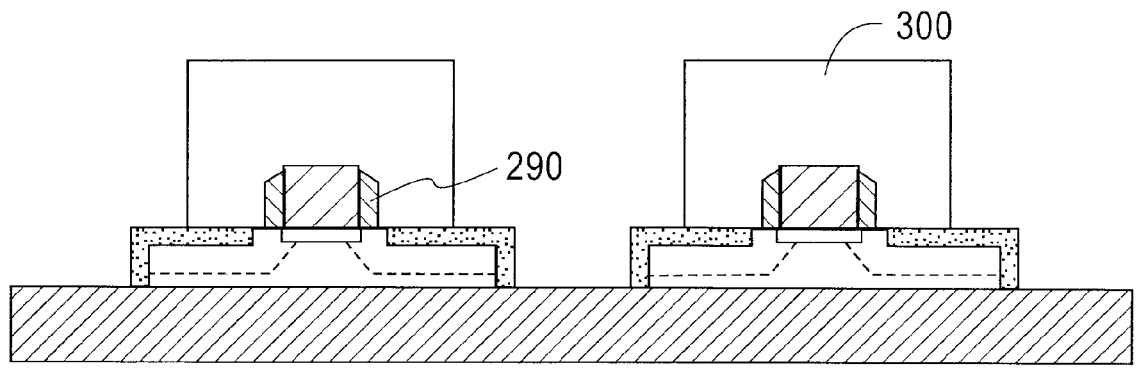

Spacers 290 are formed on the sidewalls of the gate 150, as illustrated in FIG. 7. The spacers 290 formed around the source-drain island 150 are then removed using a block mask 300. Spacers 290 preferably are removed from the sidewalls of the source-drain regions 150 to facilitate introduction of subsequent heavy doping. Alignment is not critical, since once the sidewalls along the gate 150 are cleaned, the dopant can diffuse-in laterally relatively easily, and also vertically downward from the surface.

Figure 8:
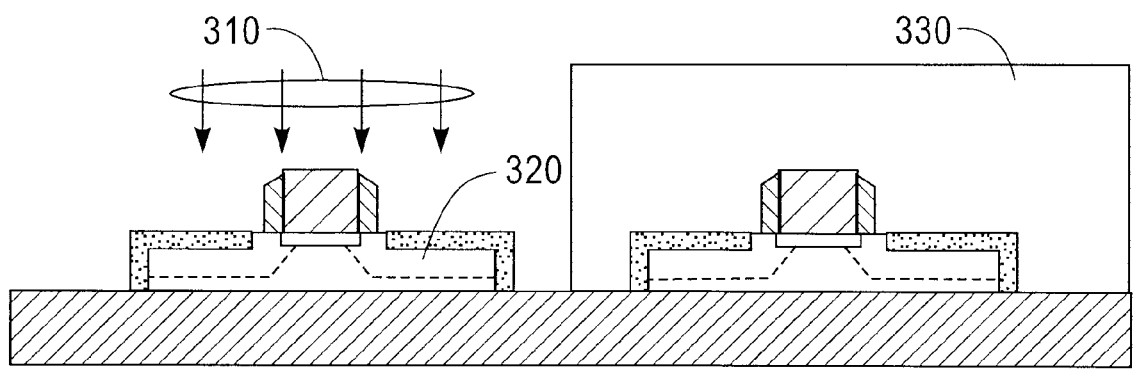
Figure 9:
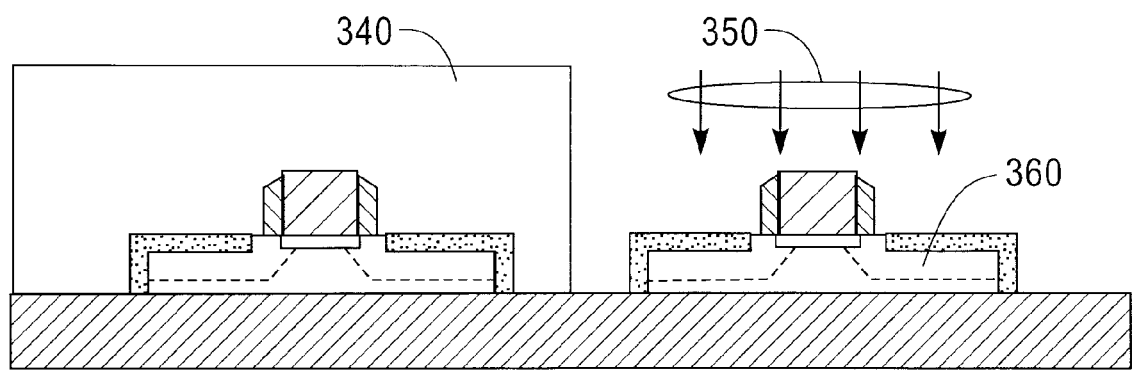
Figure 10A:
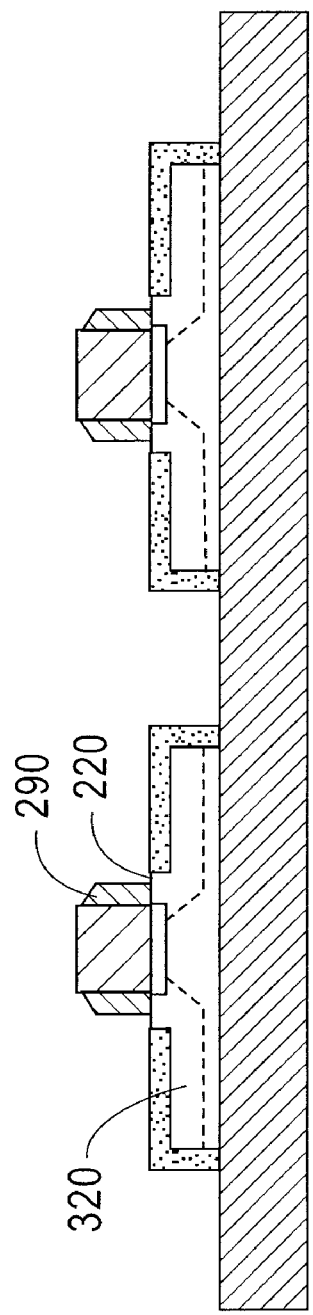
Figure 10B:
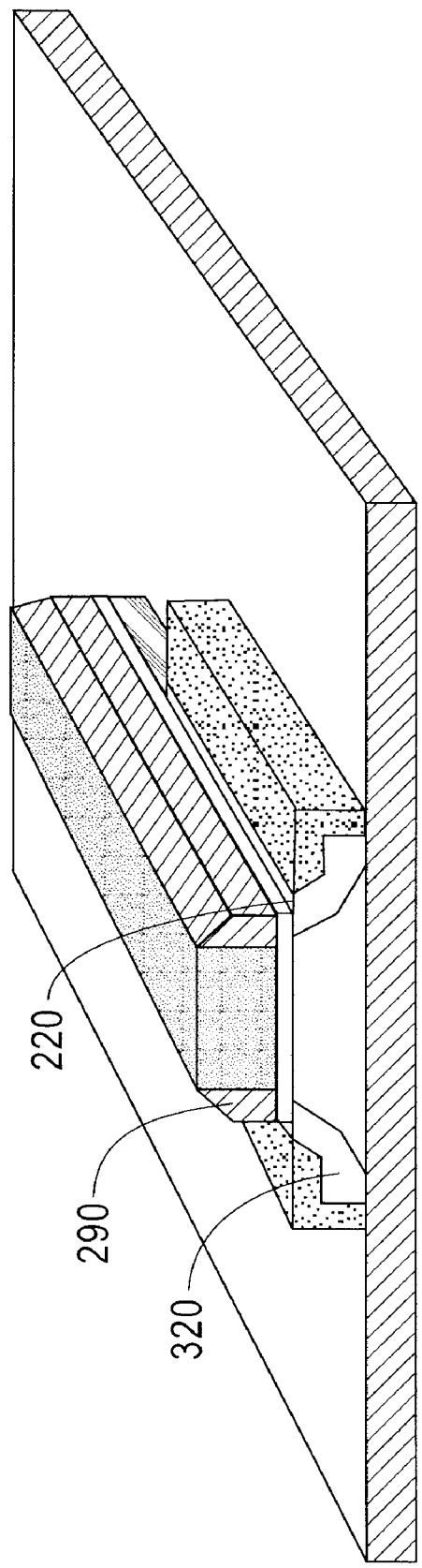

Conventional implant processes are carried out to form source-drain doping for the nMOS 110 as well as pMOS 115 as shown in FIGS. 8 and 9. First dopants (n-type or p-type) 310 form regularly doped source/drain regions 320, with a concentration in a range of $1E18/cm^3$ to $1E19/cm^3$. Second dopants (n-type or p-type) 350 form regularly doped source/drain regions 360, with a concentration in a range of $1E18/cm^3$ to $1E19/cm^3$. The cross-sectional and perspective views of the devices after source-drain formation are shown in FIGS. 10A and 10B, respectively.

Figure 11:
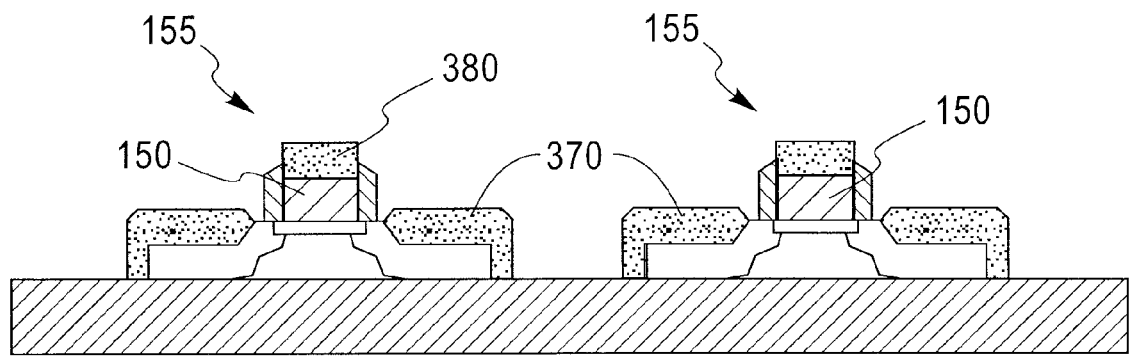

A silicide layer 370, preferably having a thickness of 10 nm to about 30 nm, is formed on the exposed source-drain islands 150, as well as the gate region 320 (e.g., see FIG. 11). The silicide 370 rapidly consumes the entire porous layer and then proceeds to convert the single crystal silicon to silicide at a much slower rate. As such, the thickness of the silicide 370 is limited to the original depth of the heavily doped p-layer. As a result, contact surface area to the diffusion region is significantly increased by controlled silicidation on the sidewalls. It is noted that the interior of the heavily doped source-drain regions always remains unsilicided. Since the source-drain dopants are driven into the single crystal silicon interior region through the porous layer, there is sufficient distance between the edge of the silicide layer and the junction to avoid spiking, and thus suppress the leakage currents.

Figure 12:
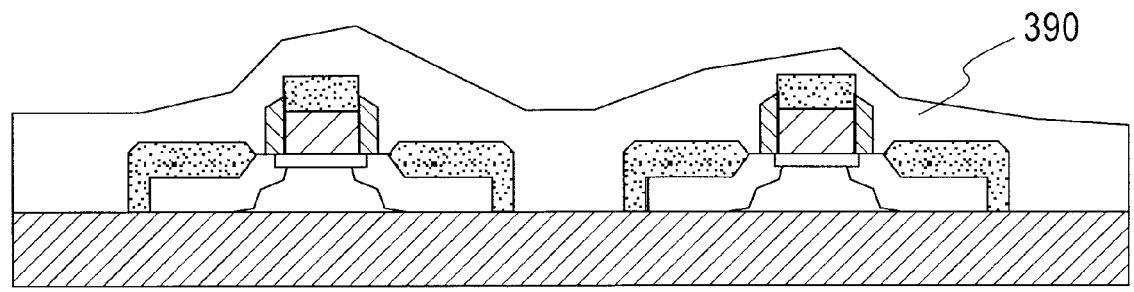
Figure 13:
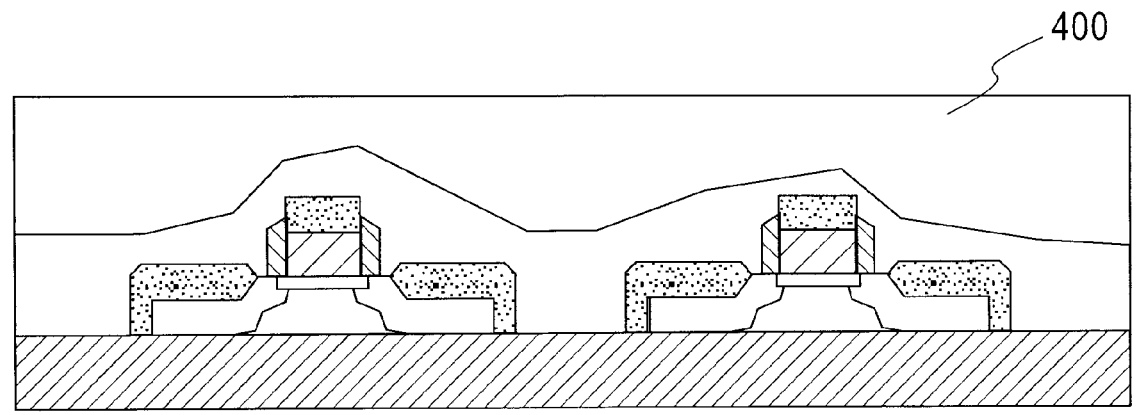

The resulting structure is planarized by spinning-on a low-k dielectric or polymer material 390 (e.g., see FIG. 12). Then, after reflow and a second coating of the low-k dielectric or polymer material 400, a touch-up planarization by etch back or a chemical-mechanical-polish (CMP) can be used to fully planarize the surface (e.g., see FIG. 13), in preparation for back-end-of-line (BEOL) processing.

Next, contacts 410 and 420 to the source/drain regions 155 and the gates 150 are formed through the low-k dielectric or polymer material 400 by conventional methods, as illustrated in FIG. 14A. The alignment of the contact is not critical. That is, slight misalignment can be tolerated without significantly degrading contact resistance.

FIGS. 14A-14C illustrate the final MOSFET device, prepared in accordance with an exemplary method of the present invention. Compared to the conventional surface silicide scheme, which is depicted in FIG. 14D, the much larger area of the contacts of this invention provides significantly reduced contact resistance below the 65 nm node. Furthermore, an unsilicided interior region is assured, which avoids the sharp increase in contact resistance seen when the silicide extends to the buried oxide layer 100.

Figure 15:
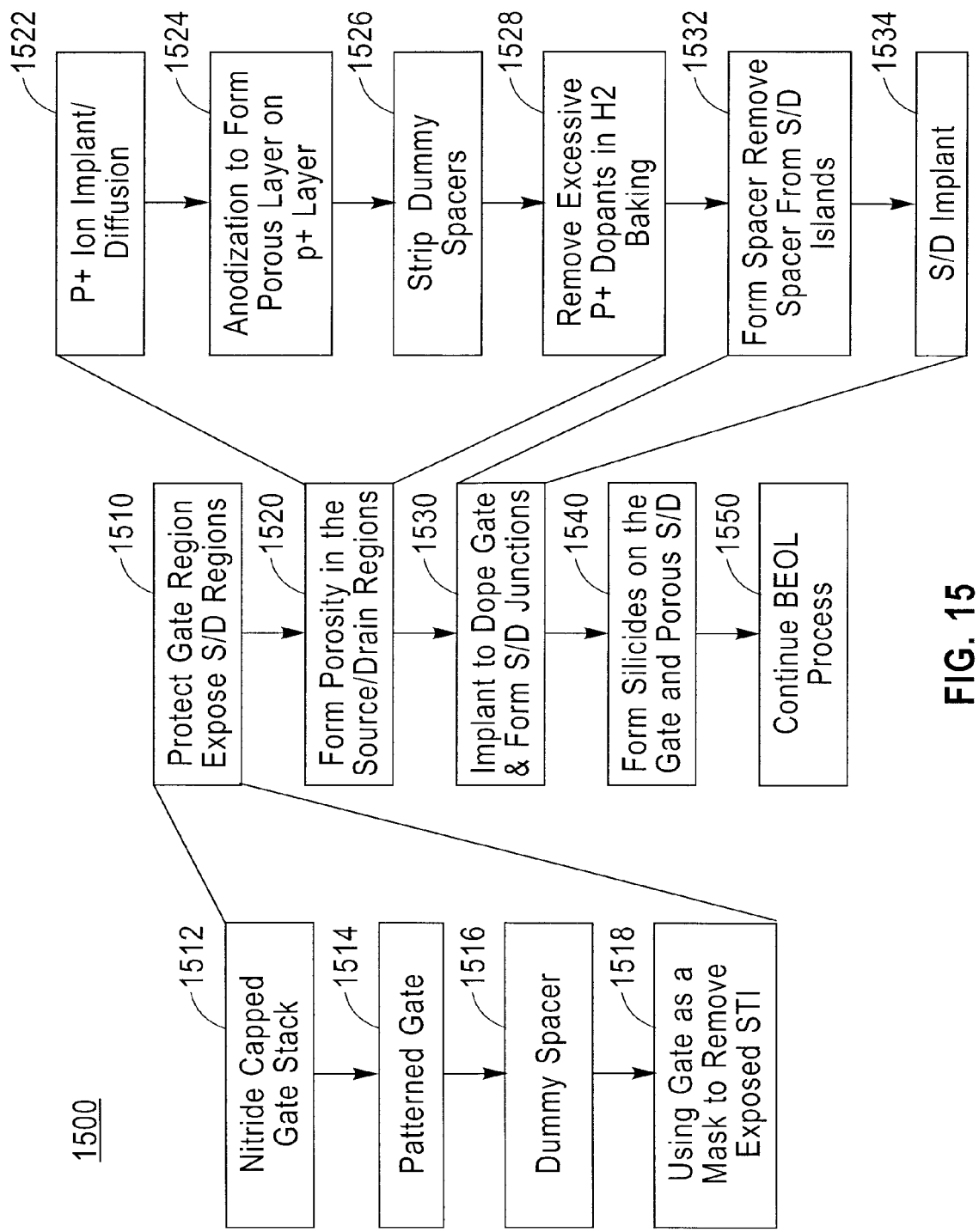
FIG. 15 illustrates a flow diagram of the overall method of the exemplary embodiment of the present invention discuss above with reference to FIGS. 1-14C.

FIG. 15 illustrates a flow diagram of the overall method of the exemplary embodiment of the present invention discussed above with reference to FIGS. 1-14C.

The method 1500 includes protecting the gate region and exposing the source/drain regions (step 1510), forming porosity in the source/drain regions (step 1520), implanting dopants into the gate and forming source/drain junctions (step 1530), forming silicide layers on the gates and the porous source/drain regions (step 1540), and continuing the BEOL process (1550).

The gate stack includes, for example, a gate dielectric, gate body and nitride cap layer, which is applied after STI is formed on the SOI substrate (step 1510). The gate is then patterned (step 1520) and dummy nitride spacers are then formed (step 1530). Next, a RIE process is carried out using the gate as the mask to remove the exposed STI material (step 1540) and expose the source/drain region (step 1500).

The next step is to form porous silicon in the exposed source/drain area with or without epitaxial growth (step 1520). This process includes doping the surface with p+ impurities (step 1522), protecting sensitive oxide regions with a nitride liner, and anodizing the p+ doped region (step 1524). The dummy spacers are then removed (step 1526), and excessive p+ dopants are depleted in a hydrogen bake (step 1528).

Implants to form LDD and halo doping, followed by a spacer formation, are conducted (step 1530). The spacers at the sidewalls of the source/drain are stripped (step 1532) before the source/drain implant (step 1534).

Silicide is then formed in the source-drain region (step 1540). A planarization process such as spin coat, reflow, etch back and CMP can be carried out, to be ready for the BEOL process (step 1550).

In accordance with certain aspects of the present invention, a method and structure are provided for reducing source/drain series resistance in ultra-thin SOI MOSFETs. The method includes formation of silicide not only on top surface of the regions, but also on the adjacent vertical surfaces. The heavily doped interior region of the source-drains remains unsilicided. This arrangement allows the contacts to the diffusions to have a large misalignment tolerance when ground rules are shrunk to below 65 nm.

Furthermore, in order to avoid Miller capacitance, as well as silicide spiking through the junction areas, a safe distance (e.g., greater than 50 nm) between the edges of the silicided layer to the gate is guaranteed by use of a sacrificial spacer technique.

Finally, to improve complete doping coverage on the exposed source and drain mesas, the sidewall spacers around the mesas are removed.

The present invention provides a robust method of precisely controlling the silicide depth in the source-drain region of a MOSFET, thus avoiding silcidation consuming the entire source-drain diffusion. The method assures than an unsilicided region remains in the interior of the source-drain. Thus, the interface area between the silicide and a single crystal silicon is increased and the series resistance is reduced.

Furthermore, the present invention provides a process for forming dummy spacers with a predetermined width for the purpose of avoiding silicide spiking into the junction area.

Additionally, another feature of the invention is to remove spacers that would otherwise cover the sidewalls of the exposed source-drain islands, thus increasing the source-drain diffusion area available for introducing dopant and for forming contacts.

While the invention has been described in terms of several exemplary embodiments, those skilled in the art will recognize that the invention can be practiced with modification within the spirit and scope of the appended claims.

Further, it is noted that, Applicants' intent is to encompass equivalents of all claim elements, even if amended later during prosecution.

What is claimed is:

1. A method of reducing contact resistance on a device, comprising:

exposing sidewalls and a portion of a top surface of a source/drain island of the device, the device comprising a planar FET device;

forming a porous silicon layer within a surface of the source/drain island;

implanting dopants in the source/drain island; and forming a silicide layer over the source/drain island.

2. The method in accordance with claim 1, further comprising:

forming dummy spacers having a predetermined width for avoiding silicide spiking into a junction area.

3. The method in accordance with claim 1, wherein the source/drain island comprises a core portion that is devoid of silicide.

4. The method in accordance with claim 1, further comprising:

forming the source/drain island on a silicon-on-insulator wafer having a buried oxide layer.

5. The method in accordance with claim 1, wherein the source/drain island comprises:

a gate dielectric layer; and a gate structure under the gate dielectric layer, comprising:

a gate;

a cap formed on a top surface of the gate; and spacers formed on side surfaces of the gate.

6. The method in accordance with claim 5, wherein the cap and the spacers comprise a nitride.

7. The method in accordance with claim 5, further comprising:
removing at least a portion of the gate dielectric layer.

8. The method in accordance with claim 1, further comprising:
forming a layer of P+ doping on an exposed surface of a silicon-on-insulator substrate.

9. The method in accordance with claim 1, wherein the silicide depth is limited to a depth of the P+ layer.

10. The method according to claim 1, further comprising removing, subsequent to said forming said porous silicon layer, excess p+ dopant from said porous silicon layer by conducting a hydrogen bake.

11. The method according to claim 1, further comprising removing, subsequent to said forming said porous silicon layer, dummy spacers to expose a surface portion of said source/drain island.

12. The method according to claim 1, wherein the device comprises a nMOS body and a pMOS body, each of said nMOS body and said pMOS body having a gate structure formed thereon, and
wherein said implanting dopants in the source/drain island comprises:
lightly doping said nMOS body, while forming a mask over said pMOS body; and
lightly doping said pMOS body, while forming a mask over said nMOS body.

13. The method according to claim 1, wherein said implanting dopants in the source/drain island further comprises:
subsequently doping said nMOS body, while forming a mask over said pMOS body to form regularly doped source/drain islands; and
subsequently doping said pMOS body, while forming a mask over said nMOS body to form regularly doped source/drain islands.

14. The method according to claim 1, wherein said forming said silicide layer comprises converting single crystal silicon in said porous silicon layer into silicide.

15. The method according to claim 1, wherein said silicide layer is formed directly on said source/drain island.

16. A method of reducing contact resistance on a device, comprising:
exposing sidewalls and a portion of a top surface of a source/drain island of the device, the device comprising a planar FET device;
selectively thickening the source/drain after exposing sidewalls of the source/drain island; and
forming a silicide layer over the source/drain island.

17. The method in accordance with claim 16, wherein said selectively thickening comprises:
performing epitaxial growth with an in-situ p+ doping.

* * * * *